United States Patent
Belk

(10) Patent No.: US 6,397,171 B1
(45) Date of Patent: May 28, 2002

(54) METHOD AND APPARATUS FOR MODELING ELECTROMAGNETIC INTERACTIONS IN ELECTRICAL CIRCUIT METALIZATIONS TO SIMULATE THEIR ELECTRICAL CHARACTERISTICS

(75) Inventor: Nathan R. Belk, Scotch Plains, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/283,394

(22) Filed: Apr. 1, 1999

(51) Int. Cl.[7] ............................ G06F 9/455; G06F 17/10
(52) U.S. Cl. .............................. 703/14; 703/2; 716/2; 716/7
(58) Field of Search ........................... 703/2, 13, 14, 703/18; 716/2, 7

(56) References Cited

U.S. PATENT DOCUMENTS

| | | | |
|---|---|---|---|
| 5,051,911 A | | 9/1991 | Kimura et al. |
| 5,497,337 A | * | 3/1996 | Ponnapalli et al. ............ 716/19 |
| 5,625,578 A | * | 4/1997 | Du Cloux et al. ............... 703/2 |
| 5,903,477 A | * | 5/1999 | Otsu et al. ........................ 703/5 |
| 6,064,808 A | * | 5/2000 | Kapur et al. ..................... 703/2 |
| 6,083,266 A | * | 7/2000 | Ohtsu et al. ..................... 703/2 |
| 6,129,459 A | * | 10/2000 | Kishimoto et al. ............. 703/5 |

OTHER PUBLICATIONS

Niknejad et al., A.M. Analysis, Design, and Optimization of Spiral Inductors and Transformers for Si RF IC's, IEEE Journal of Solid–State Circuits, vol. 33, No. 10, Oct. 1998, pp. 1470–1481.*

Belk et al., "The Simulation and Design of Integrated Inductors", Proceedings 36th Design Automation Conference, pp. 988–993, Jun. 1999.*

Duffy et al., "Analysis of the Performance of Integrated Inductors (fabricated in MCM–L Technology) in RF Amplifier Applications", Proc. 49th Electronic Components and Technology Conference, pp. 668–675, Jun. 1999.*

(List continued on next page.)

Primary Examiner—Russell W. Frejd

(57) ABSTRACT

Metalization structures are modeled by employing a basis function decomposition process for modeling the charge and/or current distributions and the interactions of those distributions on metalization structures arising from voltages and currents flowing in the metalization structures. Then, the charge and/or current distributions and their interactions are employed to obtain the electrical characteristics of a metalization structure. In one embodiment of the invention, representative sub units of the metalization structure are selected, the charge and current distributions are determined in those representative sub units, the self and mutual interactions are determined of those sub units and, then, those self and mutual interactions are used as an initial solution to describe all interactions between similar metalization sub units in the overall system of metals. These interactions are then employed to determine the impedance and admittance of each of the sub units. The impedances and admittances of the sub units are combined to obtain the overall metalization structure to be fabricated. Then, the electrical characteristics of the overall metal structure are determined. In another embodiment of the invention, the metal structure is decomposed into sub units. Repeated or representative ones of the sub units are determined and, then, decomposed into smaller sub unit elements. Sub unit impedances and admittances are determined for the sub units by using the current and/or charge distributions and their self and mutual interactions for the sub unit elements. Then, the impedances and admittances for the sub units are combined to obtain the overall metalization structure to be fabricated. Finally, the electrical characteristics are generated of the overall metalization structure.

44 Claims, 7 Drawing Sheets

OTHER PUBLICATIONS

Ehsani et al., "Computer–Aided Desing and Application of Integrated LC Filters", IEEE Transactions on Power Electronics, vol. 11, Issue 1, pp. 182–190, Jan. 1996.*

Koutsoyannopoulos et al., "Systematic Analysis and Modeling of Integrated Inductors and Transformers in RF IC Design", IEEE Transactions on Circuits and Systems II, vol. 47, Issue 8, pp. 699–713, Aug. 2000.*

Zheng et al., "An Efficient Solver for the Three–Dimensional Capacitance of the Interconnects in High Speed Digital Circuit by the Multiresolution Method of Moments", IEEE Transactions Packaging, vol. 22, Issue 1, pp. 9–15, Feb. 1999.*

Ooms et al., "Extension of the Compression Approach to INclude Device Metalizations in Electromagnetic Simulations", Digest Antennas and Propogation Society International Symposium, vol. 2, pp. 1054–1057, Jun. 1995.*

Ouda et al., "Minimizing the Computational Cost and Memory Requirements for the Capacitance of 3–D Multiconductor Syatems", IEEE Transactions on Components, Packaging and Manufacturing Technology Part A, vol. 18, Issue 3, pp. 685–689. Sep. 1995.*

* cited by examiner

100

101
102
103
104

CROSS SECTION OF METALS

100

100

100

100

100

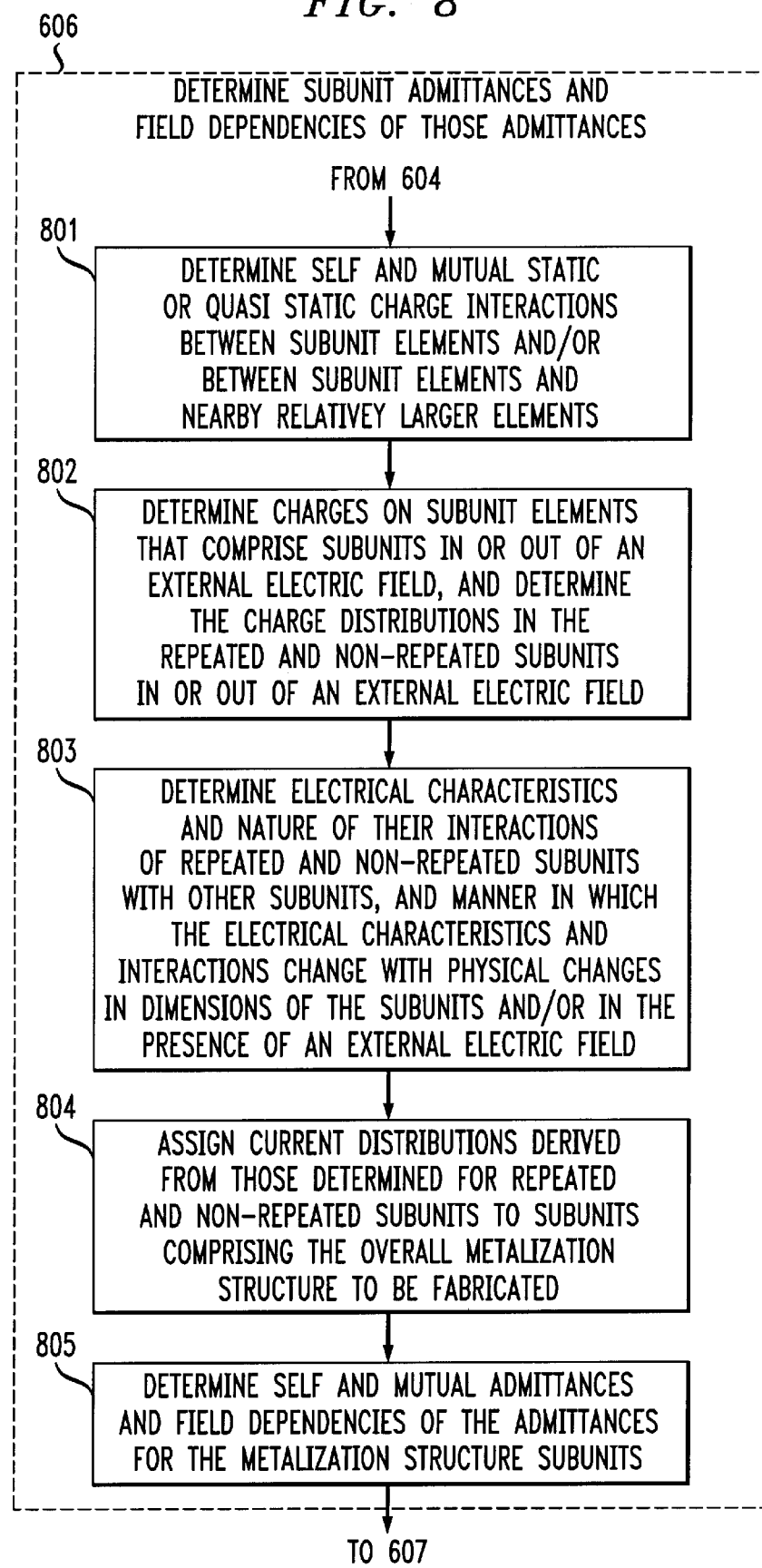

METHOD AND APPARATUS FOR MODELING ELECTROMAGNETIC INTERACTIONS IN ELECTRICAL CIRCUIT METALIZATIONS TO SIMULATE THEIR ELECTRICAL CHARACTERISTICS

RELATED APPLICATIONS

U.S. patent application Ser. Nos. 09/283,392, 09/283,393, now U.S. Pat. No. 6,289,298, and Ser. No. 09/283,395 were filed concurrently herewith.

1. Technical Field

This invention is related to the design of optimized metalization structures and, more particularly, to modeling of electromagnetic interactions in metalization structures in electrical circuits to simulate their electrical characteristics in circuits from their physical characteristics.

2. Background of the Invention

It is desirable to be able to model quickly and accurately the electrical characteristics of metalization structures, such as inductors, interconnects and the like. To obtain of these electrical characteristics requires a detailed determination of the charge and current distributions everywhere in the metalization structure. Because of very rapid three dimensional variation in charge and current density with position in known metalization structures and because these variations strongly affect the electrical characteristics of the metalization structures, an accurate and fast process for determining the charge and current distributions and the interactions between those distributions is required in order properly to determine the electrical characteristics of, inductors or other systems of metals. One family of techniques that has been used for this purpose effects a uniform or three-dimensional mesh of the entire metalization structure. However, these processes are very inefficient, i.e., slow, when employed in an attempt to model metalization structures that are largely planar as in integrated circuit melatization structures. Another family of techniques is the so-called two dimensional or quasi two dimensional processes that are significantly faster than the three dimensional processes in arriving at a model, but yield very inaccurate results for many integrated circuit metalization structures fabricated on conductive substrates.

SUMMARY OF THE INVENTION

These and other problems and limitations of prior known modeling arrangements and methods are overcome by employing a basis function decomposition process for modeling the charge and/or current distributions and the interactions of those distributions on metalization structures arising from voltages and currents flowing in the metalization structures. Then, the charge and/or current distributions and their interactions are employed to obtain the electrical characteristics of a metalization structure.

In one embodiment of the invention, representative sub units of the metalization structure are selected, the charge and current distributions are determined in those representative sub units, the self and mutual interactions are determined of those sub units and, then, those self and mutual interactions are used as an initial solution to describe all interactions between similar metalization sub units in the overall system of metals. These interactions are then employed to determine the impedance and admittance of each of the sub units. The impedances and admittances of the sub units are combined to obtain the overall metalization structure to be fabricated. Then, the electrical characteristics of the overall metal structure are determined.

In another embodiment of the invention, the metal structure is decomposed into sub units. Repeated or representative ones of the sub units are determined and, then, decomposed into smaller sub unit elements. Sub unit impedances and admittances are determined for the sub units by using the current and/or charge distributions and their self and mutual interactions for the sub unit elements. Then, the impedances and admittances for the sub units are combined to obtain the overall metalization structure to be fabricated. Finally, the electrical characteristics are generated of the overall metalization structure.

BRIEF DESCRIPTION OF THE DRAWING

FIG. 8 is a flowchart illustrating steps in a determination process for the sub unit admittance and field dependencies of those admittances of FIG. 6.

DETAILED DESCRIPTION

A. Theoretical Discussion

Figure 1A:
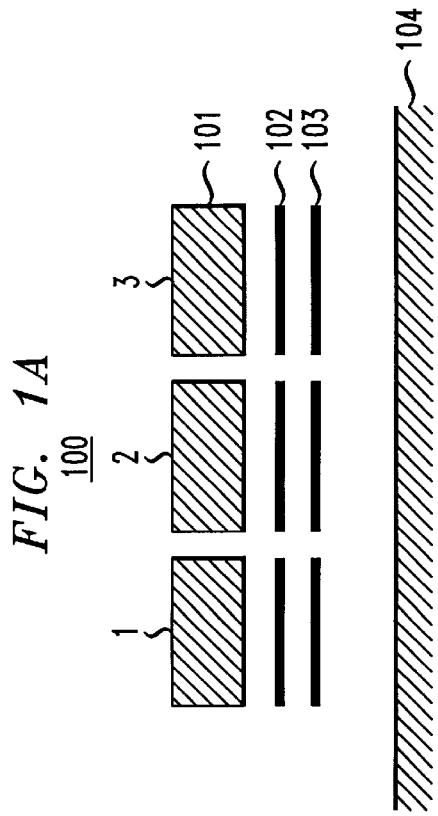
FIGS. 1A through 1C show, in simplified form, an inductor to be fabricated from circuit metalizations, as well as, the cross section of the metalization paths in the inductor.

Note that for simplicity and clarity of exposition, the embodiments of the invention are described herein in terms of inductors being fabricated on integrated circuit conductive substrates. However, it will be understood by those skilled in the art that inductors and other metal structures may be fabricated on other types of substrates, for example, on printed circuits, multi-chip module substrates or the like.

In metalization structures, it is common for metal edges to be constrained to be parallel and, because, it is a function of those metals to connect distant circuit elements, it is common for such metals to be much longer then they are wide. As a result, most metalization structures are such that they can be readily decomposed into repeated similar sub units that share important characteristics, such as, the conductor cross section. Further, because many design and fabrication processes constrain metalization bends and intersections to 90 degree angles, most metalization structures can be rapidly decomposed into so-called repeated sub units such as straight sections, right angle bends, and right angle intersections. Since, sub units of metalizations whose physical dimensions are small compared to the wavelengths of the electrical signals they can have charge and current distributions prescribed to them independently and, since, those distributions tend to be strongly similar in similar or repeated sub units, it is generally possible to decompose metalization structures into representative sub units, determine the charge and current distributions on those sub units and, then, determine the electrical characteristics of the full, i.e., overall, metalization structure from the determination of the self and mutual interactions of the structure's sub units, where the charge and current distributions that determine those interactions are assumed to be closely related to those of the representative sub units determined previously.

For metalization structures, for example, inductors or the like, fabricated on integrated circuit conductive substrates, a large component of the magnetic fields arising from the metalization currents are reflected from the conductive substrate at a phase shifted from that of the incident phase. The electric fields resulting from this component of the magnetic field are at a phase shift of $\sim\pi/4$ with respect to the inductor current, and, as a result, they contribute both a correction to the inductance and to the dominant component of the series resistance at microwave frequencies. In order to accurately model the characteristics of these inductors, it is necessary to accurately determine the magnitudes and phases of the electric fields arising from the interactions of microwave currents with the integrated circuit substrates, and to integrate those fields over the circuit metals. Below, the modeling of integrated inductors on conductive substrates is described; however, the described formalism can be used to accurately predict all electromagnetic interactions occurring between integrated circuit elements on integrated circuit substrates.

Formalism

In order to model the characteristics of integrated circuit metalization structures, a formalism is needed that accurately describes the electrical characteristics of the metalization structures. In weakly interacting systems of metals at low frequencies many effective techniques have been developed in attempts at solving this problem. However, at high frequencies and for metalizations whose thickness approaches their widths, these known techniques yield inaccurate results because they fail to account for the complex three (3) dimensional charge and current distributions on metalizations. Indeed, because the effects of the integrated circuit substrates on inductor fields are slowly varying functions of position, the inductor series resistances and inductances can be determined by using these methods and, then, the substrate effects are superimposed on them.

In what follows, the determination for the characteristics of the electric field generated by a point current source located in the metal stack of an integrated circuit wafer is described. The resultant electric field is divided into two components: (1) the field from a static or time invariant point source of current or charge without substrate interactions, and (2) the effects of the substrate on those fields. Then, the electrical characteristics of the overall metalization structure are determined by decomposing the metalization structure into sub units, determining the electrical characteristics of the sub units and, then, assembling the overall metalization structure from the sub units whose characteristics have been determined. Note that in both the determination of the electrical characteristics of the sub units and the determination of the overall metalization structure, the determination process starts with a static determination on the metals and, then, the substrate interactions are superimposed on that determination.

The potential $\Phi$, describing the radiation arising from a point current source of frequency $f$ at a vector/separation between the point current source and an observation point of r=0, is given as the solution to the inhomogeneous Helmholz wave equation:

$$\left[\nabla^2 + \frac{(2\pi f)^2}{c^2}\right]\Phi(r, f) = \delta(r), \quad (1)$$

where c is the speed of light in the media. The electric field generated by this current element is:

$$E(r) = 2\pi i f \mu_0 \left(\bar{I} + \frac{\nabla \nabla}{k^2}\right)\Phi, \quad (2)$$

where $k=2\pi f/c$, $\bar{I}$ is the identity matrix and, again, r is the vector/separation between the point current source and the observation point.

The derivatives on the right of Equation 2 describe the electric field from the scalar potential, while $\bar{I}$ determines the component arising from the vector potential. For example, for a metal sub unit 100 $\mu$m in length, the component of the electric field from the scalar potential $[O(1/r^3)]$ will be many orders of magnitude larger than that from the vector potential $[O(1/r)]$ and will complicate the accurate evaluation of the component arising from the vector potential. However, because of the small size of the sub unit, the component of the electric field arising from the scalar potential will result in a displacement current variation parallel to that sub unit that is orders of magnitude smaller than the current through that sub unit. Further, because the time dependent magnetic field arising from this displacement current does not couple strongly to the metalization sub unit, the fields arising from the displacement current are not important for sub units of dimensions $<f/(10c)\sim1$ cm. For these reasons, only the component of the electric field arising from the vector potential is retained in Equation 2, and the effects of the scalar potential are treated through the determination and incorporation of metalization capacitances, as discussed below.

In inhomogeneous planar media, the form for the electric field in Equation 2 is inconvenient; therefore, it is advantageous to use Somerfeld's identity for the determination of the potentials, namely:

$$\Phi(r, k) = i' \int_0^\infty dk_\rho \frac{k_\rho}{k_z} J_0(k_\rho \rho)\left[e^{ik|z-z'|} + A_+ e^{-ik_z z} + A_- e^{ik_z z}\right], \quad (3)$$

where $i'=\sqrt{-1}$, z' is the height of the source, $A_+$ is the amplitude of the waves reflected from above, and $A_-$ is the amplitude of the waves reflected from below the metalizations.

Equation 3 decomposes the spherically symmetric form for the electric field into an integral over evanescent and traveling waves ($e^{ik_z z}$) *in the $\hat{z}$ direction and cylindrically symmetrical waves*$[J_0(k_\rho\rho)]$ in the $\hat{\rho}$ direction with $k^2=k_\rho^2+k_z^2$. For integrated circuit substrates, the wave propagation in the $\hat{z}$ direction is determined by the reflection and transmission coefficients at each dielectric interface that are determined by the frequency dependent dielectric constants of each layer. As discussed, for the integrated circuit process, $A_-$ will be dominated by the electric fields reflected from the conductive substrates. With the determination of $A_+$ and $A_-$, the potentials are determined from a point current in the vicinity of the substrate. Using Equation 3, the electric fields can be determined at all places in the metalization stack arising from currents anywhere in the metal stack of the integrated circuit wafer.

With the determination of $A_+$ and $A_-$, Green's function is determined, which relates the electric field $E(\rho,z)$ and electric (scalar) potential $\Phi(r,k)$ to the current dipole $\hat{x}I(\rho',z')dl$ for the integrated circuit substrate, and are expressed (or it may be desirable to remove several images, especially for the scalar potential, or solve for A in the limit of infinite substrate conductivity) in the following form:

$$E(\rho,z) = \hat{x}I(\rho',z')dl \frac{if}{\varepsilon_0 c^2} \int_0^\infty k_\rho G \cdot J(k_\rho \rho) dk_\rho, \text{ and} \quad (4)$$

$$\Phi(r,k) = \frac{1}{2\pi\varepsilon} \int_0^\infty k_\rho dk_\rho Gs\rho \cdot J_0(k_\rho \rho). \quad (5)$$

Application of Green's Function for Circuit Modeling

As discussed, the forms for the electric field in Equation 4 and the electric potential in Equation 5 are inconvenient because the integrals therein converge slowly and E diverges as $1/\rho$ for small $\rho$, making the evaluation of the self induced electric fields difficult. The divergence can be removed by observing that:

$$\frac{1}{2} \int_0^\infty J_0(k_\rho \rho) dk_\rho = \frac{1}{\rho}. \quad (6)$$

As a result, the electric field at($\rho$,z) and the electric (scalar) potential at ($\rho$,z) arising from a point current source at ($\rho$',z') can be written as:

$$\overline{E}(\rho,z) = I(\rho',z') \frac{if \cdot d\overline{l}}{\varepsilon_0 c^2} \left[ \int_0^\infty \left( k_\rho G(z,z') - \frac{1}{2} \right) \right. \quad (7)$$
$$\left. J_0(k_\rho|\rho-\rho'|)dk_\rho + \frac{1}{2|\rho-\rho'|} \right], \text{ and}$$

$$\Phi(r,k) = \frac{1}{2\pi\varepsilon} \left[ \int_0^\infty \left( k_\rho Gs\rho(z-z') - \frac{1}{2} \right) \right. \quad (8)$$
$$\left. J_0(k_\rho|\rho-\rho'|)dk_\rho + \frac{1}{2|\rho-\rho'|} \right],$$

respectively.

The second term in the square brackets on the right of Equation 7 is Neuman's Equation for the electric fields generated by current carrying elements in free space with dimensions that are much less than the wavelength of light at zero (0) frequency. The integral on the right side of Equation 7 is dominated by the induced substrate currents and describes the difference between an ideal inductor and an inductor fabricated on an integrated circuit process. Because the skin depth in the integrated circuit substrate is >200 $\mu$m, the fields arising from the substrate coupling are a slowly varying function of $\rho$ and can be evaluated at intervals of $\rho$~5 $\mu$m and at frequencies of ~0.5 GHz. These frequency and position dependent values are stored in an array $\Theta_{f,\rho}$ that is used as a look up table for inductor calculations.

The second term in the square brackets of the right of Equation 8 is the equation for the potential generated by a point charge in a uniform dielectric at zero (0) frequency. The integral on the right side of Equation 8 is dominated by the induced surface charge that resides at the boundary between the conductive substrate and the insulating oxides. Because the oxide thickness in the integrated circuit is >1 $\mu$m, the fields arising from the substrate coupling in the scalar potential are more rapidly varying functions of $\rho$ and for small inter element separation needs to be evaluated at intervals of $\rho$~1 $\mu$m and at frequency intervals of ~0.5 GHz. These frequency and position dependent values are stored in an array $\Theta_{f,\rho}$ that is used as a look up table for inductor calculations. It is often convenient to subtract two images from the scalar potential Green's function in Equation 8, this reduces the size of $\Theta_{f,\rho}$ but increases the complexity of the static potential calculations discussed below.

Basis Function Determination of Metalization Impedances and Admittances

In what follows, it is shown how basis functions in conjunction with Equation 7 and Equation 8 can be used to create a complex mutual and self-inductance matrix, as well as, the quasi static inter metal capacitance matrix fully accounting for substrate interactions. These processes can be employed alone or in combination with traditional simulation processes to determine complex metalization structures.

The metalization structure to be fabricated is decomposed into paths of electrical conductivity and those paths are decomposed into a system of straight polygons, 45 or 90 degree bends and 90 degree intersections of constant cross section. The resulting structures, referred to as sub units, are categorized according to whether or not their cross sections match the cross sections of other sub units. All sub units with the same cross section and performing the same function, e.g., 45 degree bends, are referred to as repeated sub units and are represented with the same basis function, in a manner described below. Sub units whose function or cross section is not repeated are referred to as non-repeated and are represented by different basis functions. Both the repeated and non-repeated sub units are decomposed into sets of significantly smaller sized elements than the sub units.

Figure 3:
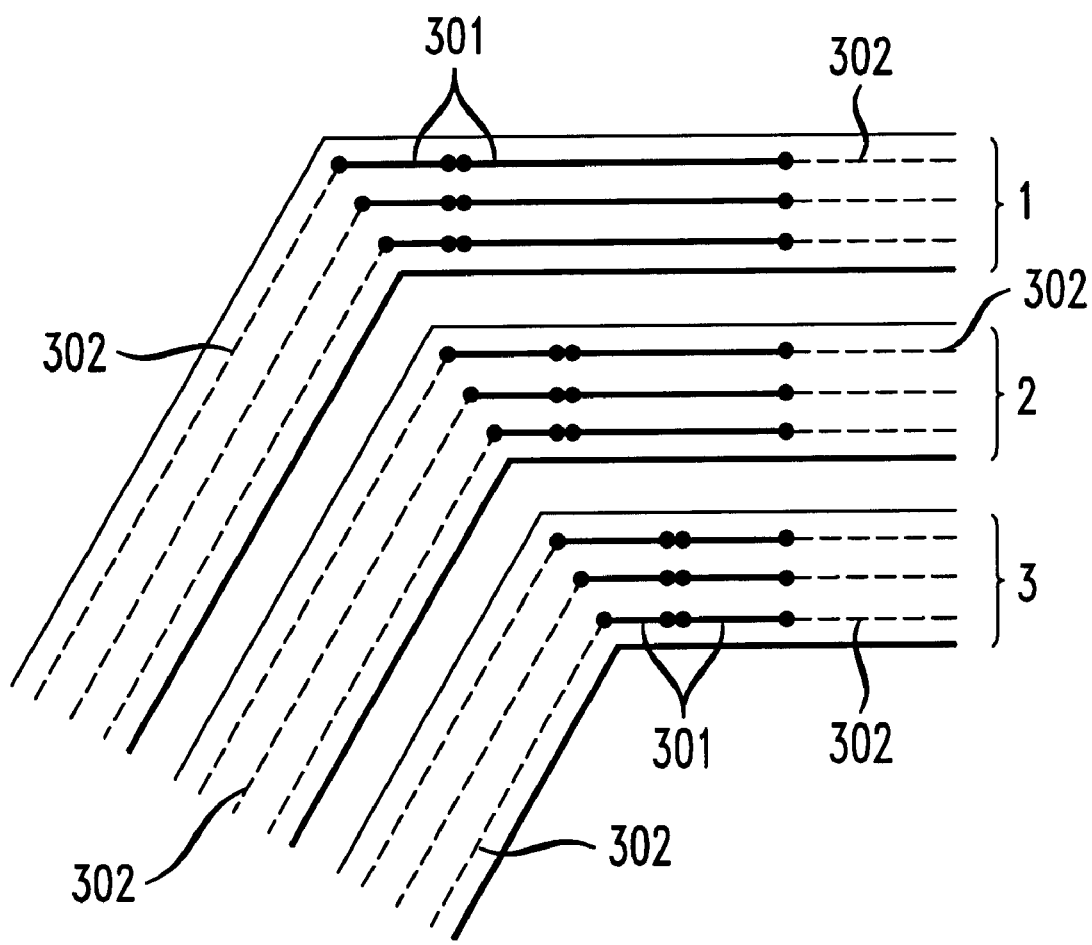
FIG. 3 is a graphical representation illustrating test elements relative to lines of charge/current in a section of the inductor of FIG. 1.

The determination of the electrical characteristics of an integrated circuit inductor is used to outline this procedure. In order to calculate the series self and mutual impedances of the sub units, as well as, inter sub unit and sub unit to substrate admittances necessary to describe an integrated circuit inductor; representative sub units are selected from that inductor. Each of the sub units is then broken down into an array of short and long metal elements or paths that carry a current or charge distribution that must be determined. FIGS. 1B and 1C show an inductor, the sub units selected from it, and the sub elements within the sub units. In this example, for purposes of illustration, three (3) sub units are denoted as being in a group. Indeed, any desired number of sub units may be incorporated into groups depending on the application of the invention. As shown in FIG. 3, on or near each of the current or charge carrying elements is a test element" which spans the region between the dots on each of the current or charge carrying elements. There are two methods by which the basis functions for this type of structure can be constructed. In strongly coupled structures, such as inductors, it is often advantageous to determine groups of sub units self consistently. Thus, in the inductor shown in FIGS. 1B and 1C, the three sub units in a group can be solved simultaneously or independently. The differences between the two methods will be discussed below. Although the elements in FIGS. 1B and 1C are depicted in two dimensions in the material presented below, it is assumed that they are arrayed in three dimensions. In what follows, test elements are used which are smaller than the charge or current carrying elements, however, this is not generally required. The field or potential on each of the test elements arising from the current or charge on the longer elements is determined by the sum of two components. The first component, the self induced field and potential of a sub unit element of radius $\rho$ whose endpoints are offset by the distances $x_{a,b} = x_{i,a} - x_{j,b}$ in the direction parallel to their lengths are determined by:

$$ms_{i,j} = \frac{\mu_0}{2\pi} \sum_{a=-1}^{1} \sum_{b=-1}^{1} (-1)^{1+b} \cdot \left[ \frac{(\rho^2 + x_{i,j})^{3/2} + |x_{i,j}|^3}{3\rho^2} + \frac{|x_{i,j}|}{2} \cdot \log\left(\frac{2 \cdot x_{i,j}}{\rho}\right) \right], \text{ and} \tag{9}$$

$$\Phi s_{i,j} = \frac{1}{2\pi\varepsilon} \sum_{a=-1}^{1} \sum_{b=-1}^{1} (-1)^{1+b} \cdot \left[ \frac{(\rho^2 + x_{i,j})^{3/2} + |x_{i,j}|^3}{3\rho^2} + \frac{|x_{i,j}|}{2} \cdot \log\left(\frac{2 \cdot x_{i,j}}{\rho}\right) \right], \tag{10}$$

respectively, where the origin of the coordinate system has been chosen such that $$\sum_{a,b=\pm 1} x_{a,b} = 0.$$

The zero frequency metal resistance of a test element is given by:

$$rs_i = \frac{\ln_i}{w_i} Rsq, \tag{11}$$

where Rsq is the metal resistance in ohms per square, $w_i$ is the width and $\ln_i$ is the length of the test element. The second component, arising from the mutual coupling of adjacent lines of current or charge that are separated from the test element by a distance $\rho$ normal to their lengths, and whose endpoints are offset from those of the test element by the distances $x_{a,b} = x_{i,a} - x_{j,b}$ in a direction parallel to their lengths, is given by:

$$m\rho_{i,j} = \frac{\mu_0}{4\pi} \sum_{a=-1}^{1} \sum_{b=-1}^{1} (-1)^{a+b} \cdot \left[ (\rho^2 + x_{a,b}^2)^{1/2} + x_{a,b} \cdot \operatorname{arcsin}h\left(\frac{x_{a,b}}{\rho}\right) \right], \text{ and} \tag{12}$$

$$\Phi\rho_{i,j} = \frac{1}{4\pi\varepsilon} \sum_{a=-1}^{1} \sum_{b=-1}^{1} (-1)^{a+b} \cdot \left[ (\rho^2 + x_{a,b}^2)^{1/2} + x_{a,b} \cdot \operatorname{arcsin}h\left(\frac{x_{a,b}}{\rho}\right) \right], \tag{13}$$

respectively, where again $$\sum_{a,b=\pm 1} x_{a,b} = 0.$$

For test elements that are not parallel to the lines of current or charge, the mutual coupling are:

$$mn\rho_{i,j} = \frac{\mu_0}{4\pi} \frac{\cos\varphi}{\cos\varphi/2} \sum_{a=0}^{1} \sum_{b=0}^{1} (-1)^{a+b} \left\{ \begin{array}{l} -X_{a,b} - \frac{D_b}{\sin\varphi} \ln\left(X_{a,b} + \sqrt{X_{a,b}^2 + D_b^2}\right) + \\ \frac{D_b}{\tan\varphi} \ln\left(\frac{X_{a,b}\cos\varphi + D_b\sin\varphi + \sqrt{X_{a,b}^2 + D_b^2}}{2}\right) + \\ X_{a,b}\ln\left(-X_{a,b}\cos\varphi - D_b\sin\varphi + \sqrt{X_{a,b}^2 + D_b^2}\right) \end{array} \right\}, \tag{14}$$

$$\phi n\rho_{i,j} = \frac{1}{4\pi\varepsilon} \frac{\cos\varphi}{\cos\varphi/2} \sum_{a=0}^{1} \sum_{b=0}^{1} (-1)^{a+b} \left\{ \begin{array}{l} -X_{a,b} - \frac{D_b}{\sin\varphi} \ln\left(X_{a,b} + \sqrt{X_{a,b}^2 + D_b^2}\right) + \\ \frac{D_b}{\tan\varphi} \ln\left(\frac{X_{a,b}\cos\varphi + D_b\sin\varphi + \sqrt{X_{a,b}^2 + D_b^2}}{2}\right) + \\ X_{a,b}\ln\left(-X_{a,b}\cos\varphi - D_b\sin\varphi + \sqrt{X_{a,b}^2 + D_b^2}\right) \end{array} \right\}, \tag{15}$$

respectively, where $D_b = d \cos^2 \phi/2 - [(-1)^b \text{t+u}/2] \sin \phi$, $X_{a,b} = s(-1)^a - B_b$ and $B_b = (-1)^b t \cos \phi + u[1+\cos \phi]/2 + d \sin \phi/2$. $\phi$ is the angle between the elements, u and d are, respectively, the offsets of their midpoints along the lines parallel to and perpendicular to the line bisecting the angle between those elements. s and t are the lengths of the projections of the sub elements along the line bisecting those elements.

The component of the electric field and potential arising from the substrate interactions can be determined through the following equations 16 and 17, respectively:

$$z_{i,j} = \sum_{0}^{\frac{Ln_j}{\Delta l_j}} \sum_{0}^{\frac{Ln_i}{\Delta l_i}} \Theta_{f,p} \overline{\Delta l_i} \cdot \overline{\Delta l_j}, \text{ and} \tag{16}$$

$$\varphi_{i,j} = \sum_{0}^{\frac{Ln_j}{\Delta l_j}} \sum_{0}^{\frac{Ln_i}{\Delta l_i}} \Phi_{f,p} \overline{\Delta l_i} \cdot \overline{\Delta l_j}. \tag{17}$$

where the $\Theta_{f,\rho}$ are coefficients from the substrate coupling matrix, the vectors $\overline{\Delta l_i}$ and $\overline{\Delta l_j}$ are the summation intervals, $\rho$ is the separation between the centers of the summation intervals, and the summations are over every sub unit in the inductor including its input and output leads. The series impedances described in Equations 9, 11, 14 and 16 are combined in the form:

$$\delta v_i = (2\pi i f m s_{i,1} + rs_i + z_{i,1}) I_i + 2\pi i f \sum_{j \neq i} I_j (m\rho_{i,j} + mn\rho_{i,j} + z_{i,j}), \tag{18}$$

where $\delta v_i$ is the voltage across the $i^{th}$ metalization test element arising from the currents in each of the $j^{th}$ sub units. If the impedances for all three (3) sub units are determined simultaneously, Equation 18 will run over all current elements in the three sub units. If the impedances for the three sub units are determined independently, Equation 18 need not include terms for more than one sub unit as its impedances are being determined.

The $\delta v_i$ are generally taken to be the same for all parallel test elements even in the presence of fields from other current carrying metalization sub units. Since, it is often necessary to find the physical characteristics of a sub unit in an external electric field arising from the currents in other sub units, the effect of external electric fields can be added to the left of Equation 18 through terms of the form:

$$E(x_0) + \frac{\partial E}{\partial x} \cdot 2 \frac{(x - x_0)}{ws} + \frac{\partial^2 E}{\partial x^2} \cdot \left(6 \frac{(x - x_0)^2}{ws^2} - \frac{1}{2}\right) + \ldots, \tag{19}$$

where x is taken along a line that intersects the end of each of the parallel test elements, $x_0$ is at the center of the sub unit, ws is the width of a particular sub unit and adjustments are made to the magnitude of the electric field, E, and its derivatives.

Because the wavelengths of the electrical signals ($\geq 3$ cm) are much longer than a typical integrated circuit chip dimension, for most applications, the external E-fields in Equation 19 can be approximated as arising from excitation currents in the overall metalization structure whose distributions are invariant across the widths of their metalization sub units. In this situation, it is possible to determine the sub unit current distributions in the E-fields from a uniform current in all structures outside of the regions of the current carrying elements described in Equation 18. Finally, large sub units of a metalization structure can be excited independently to determine the interactions between those sub units. In structures such as the inductor shown in FIGS. 1B and 1C, each turn, including its sub unit, can be excited with a current independently, the three sub units can be solved for each excitation, and the sub unit current distribution and electrical properties can then be determined as a function of their self and adjacent turn currents.

For structures lacking the symmetry of the structure shown in FIGS. 1B and 1C, it is often desirable to solve Equations 18 and 19 independently for each significant term in the electric field expansion (Equation 19) so that the field dependence of the sub unit current distribution and its resulting electrical properties can be quantified. Following this procedure, in the determination of the overall metalization structure the effects of the field dependence of a sub unit current distribution will be accurately represented.

Because the sub units are small compared to the wavelength of the electrical signal, the sum of the currents in the elements is roughly constant so that the current entering a given sub unit is the same as that exiting the sub unit. This constraint is implemented for sub units being excited through requiring that:

$$\Sigma I_j = 1 \tag{20}$$

For sub units that are not excited, the constraint is:

$$\Sigma I_j = 0. \tag{21}$$

As described above, the simultaneous solution of Equations 18 and 19 along with constraints of Equations 20 and 21 allow the determination of the field dependent current distribution of the sub unit.

In order to determine the electrical characteristics of the sub unit, use is made of the current distribution on the sub unit along with the voltage difference ($\delta v_i$) on the left of Equation 18.

The complex in the field sub unit impedance is determined by the sub unit voltage differences $\delta v_i$ divided by the sub unit current, namely:

$$Z_{i,j} = \frac{\delta v_i}{I_j}. \tag{22}$$

The mutual interactions between two sub units, for example, A and B, can be determined through $$M_{A,B} = \sum_i \sum_j (m \rho_{i,j} + mn \rho_{i,j}) I_{A,i} \cdot I_{B,j}, \tag{23}$$

where the $I_i$ and the $I_j$ are the currents on the $I^{th}$ and $J^{th}$ sub elements of the $A^{th}$ and $B^{th}$ sub units, respectively.

A more efficient manner for the determining and expressing the mutual interactions between sub units is through multipole decomposition. In this process, the current distributions on the sub units are decomposed into mathematically orthogonal distribution functions that efficiently capture the differing properties of the components of the current distributions. These current distribution functions generate electric fields whose spatial dependence is stored in a look up table, and these electric fields can then be used to determine the couplings of the adjacent sub units. Following this procedure, the most convenient current distribution functions are $$f_n = 1, x, \frac{3x^2}{2} - 1/2, \ldots.$$

The magnitude of the component $a_n$ of each of the $f_n$ in a sub unit current distribution is:

$$a_n = \frac{2n+1}{N} \sum_{i=0}^{N-1} f_n\left(\frac{2i-N+1}{N-1}\right) \cdot I_i, \tag{24}$$

where $a_n$ then represents the component of the function $f_n$ in the sub unit current distribution. The electric field generated by $a_n$ is given by:

$$E_n(2\rho/w, \theta) = \frac{if \mu_0 N}{2w} \cdot \int_{-1}^{1} \frac{a_n f_n dx}{(\rho^2 + 2\rho x \cos\theta + x^2)^{1/2}}, \tag{25}$$

where w is the width of the sub units, $\rho$ is the distance to the center of the distribution being represented and $\theta$ is the angle between the current flow and line between the point current source and observation points. Because these E-fields also determine the mutual inductances between sub units, these solutions permit the full determination of the series impedances of the overall metalization structure.

A method for determining the variation of the sub unit self and mutual electrical properties that arise from variations in sub unit length is to decompose a sub unit of perturbed length into the sum of the original sub unit plus a short physical extension to the sub unit. The self and mutual electrical characteristics of the sub unit extension can be determined through substitution of the previously determined sub unit current distribution (found through Equation 18) into Equations 9, 11, 12, 14, and 25 that describe the self and mutual interactions between current elements that represent the sub unit extension.

In order to determine the overall system of series impedances it is necessary to first assemble the overall system from the determined sub units, determine the coupling between the sub units, and tabulate these properties with their self-impedances.

The component of the induced fields between the metalization structure sub units arising from the substrate interactions can be determined through the effective mutual and self impedances generated by the substrate coupling, through the use of the following equation:

$$Z_{i,j} = \sum_0^{\frac{Ln_i}{\Delta l_j}} \sum_0^{\frac{Ln_i}{\Delta l_i}} \Theta_{f,\rho} \overline{\Delta l_i} \cdot \overline{\Delta l_j}, \tag{26}$$

where the $\Theta_{f,\rho}$ are coefficients from the substrate coupling matrix, the vectors $\overline{\Delta l_i}$ and $\overline{\Delta l_j}$ are the summation intervals, $\rho$ is the separation between the centers of the summation intervals, and the summations are over every sub unit in the inductor including its input and output leads. The series impedances described in Equations 15 through 22 are combined in the form:

$$V_i - V_{i-1} = (Zs_{i,i} + Z_{i,i})I_i + 2\pi i f \sum_{j \neq i} I_j(M_{i,j} + Zs_{i,j}), \quad (27)$$

where $V_i - V_{i-1}$ is the voltage across the $i^{th}$ metal sub element arising from the currents in each of the $j^{th}$ sub units and the $M_{i,j}$ in Equation 27 are determined from the $a_n$ of Equation 24 and the $E_n$ of Equation 25.

To determine the complex admittance matrix for the metalization structure, the potentials described in Equations 10, 13, 15 and 17 are combined in the form:

$$\phi_j = (\phi s_{i,j} + \phi s b_{i,j})q_j + \sum_{i \neq j} q_i(\phi \rho_{i,j} + \phi n \rho_{i,j} + \phi s b_{i,j}). \quad (28)$$

If all three (3) sub units are solved simultaneously, Equation 28 will run over all charge elements in the three sub units. If the sub units are solved independently Equation 28 need not include terms from more than one sub unit as it is being solved.

The $\phi_j$ are generally the same for all parallel test elements. It is often necessary to find the physical characteristics of the sub units in the external electric potential arising from the charges in other sub units. These external potentials can be added to the left of Equation 28 through terms of the form:

$$\Phi(x_0) + \frac{\partial \Phi}{\partial x} \cdot 2 \frac{(x - x_0)}{ws} + \frac{\partial^2 \Phi}{\partial x^2} \cdot \left(6 \frac{(x - x_0)^2}{ws^2} - \frac{1}{2}\right) + \ldots, \quad (29)$$

where x is taken to be along the line which intersects the end of each of the parallel test elements, $x_0$ is at the center of the sub unit and adjustments are made to the magnitude of the potential $\Phi$ and its derivatives. Unlike the metalization currents, there can be significant variation in magnitude of the charge along the length of the metalization sub unit, consequently, additional terms can be added to Equation 29 to account for these variations. Note, however, that these variations tend to be limited by the screening effects of the substrate.

In structures such as the inductor shown in FIGS. 1B and 1C, the sub unit in each turn can be excited with a voltage independently, the three sub units can be solved for each excitation, and the sub unit charge distribution and electrical properties can then be determined as a function of their self and adjacent turn voltages.

For structures lacking the symmetry of the structure in FIGS. 1B and 1C, it is often desirable to solve Equations 28 and 29 independently for each significant term in the electric potential expansion (Equation 29) so that the dependence of the sub unit charge distribution and, therefore, its electrical properties on the potential or its derivatives can be quantified. Then, in the determination of the overall metalization structure, the effects of the field dependence of a sub unit charge distribution will be accurately represented as it responds to the potential variations generated by the charge distributions in other system sub units.

Because the sub units are small compared to the wavelength of the electrical signal, voltages of the elements in and connected to the sub units is roughly constant so that the whole structure can be assigned a constant voltage during its determination. This constraint is implemented for sub units being excited through requiring that:

$$\phi_i = 1. \quad (30)$$

For sub units that are not being excited, the constraint is:

$$\phi_i = 0. \quad (31)$$

As described above, the simultaneous solution of Equations 28 through 31 allows the field dependent charge distribution of the sub unit to be obtained.

In order to determine the characteristics of the sub unit, the charge distribution on the sub unit is used, as well as, the difference between the sub unit voltage $\phi_i$ on the left of Equation 28 and that of adjacent structures. The complex in field sub unit admittance is determined by the total sub unit charge divided by the sub unit voltage, namely:

$$Y\rho_{i,j} = \frac{qtot_i}{\phi_j}, \quad (32)$$

where $qtot_i$ is the sum of the charge on the region of the charge carrying elements spanned by the test elements.

The mutual interactions between two sub units, for example, A and B, can be determined through:

$$C_{A,B} = \sum_i \sum_j (\phi \rho_{i,j} + \phi n \rho_{i,j} + \phi s b_{i,j})q_{A,i} \cdot q_{B,j}, \quad (33)$$

where the $q_{A,i}$ and the $q_{B,j}$ are the charges on the $A^{th}$ and $B^{th}$ sub units, respectively.

A more efficient manner for the determining and expressing the mutual interactions between sub units is through multipole decomposition. In this process, the charge distributions on the sub units are decomposed into mathematically orthogonal distribution functions that efficiently capture the differing properties of the components of the charge distributions. These charge distribution functions generate potentials whose spatial dependence is stored in a look up table, and these spatial dependent potentials can then be used to determine the couplings of the adjacent sub units. Following this procedure, the most convenient current distribution functions are $$f_n = 1, x, \frac{3x^2}{2} - 1/2, \ldots .$$

The magnitude of the component $a'_n$ of each of the $f_n$ a sub unit charge distribution is:

$$a'_n = \frac{2n+1}{N} \sum_{i=0}^{N-1} f_n\left(\frac{2i - N + 1}{N - 1}\right) \cdot q_i, \quad (34)$$

where $a'_n$ then represents the component of the function $f_n$ in the sub unit charge distribution. The potential generated by $a'_n$ is given by:

$$\Phi(\rho/w, \theta) = \frac{N}{4\pi \varepsilon w} \int_{-1}^{1} \left( \frac{1}{(\rho^2 + 2\rho x \cos\theta + x^2)^{1/2}} - \frac{1}{(\rho^2 + 2\rho x \cos\theta + x^2 + 4z^2)^{1/2}} \right) \cdot a'_n f_n dx$$

(35), where w is the width of the sub units, $\rho$ is the distance to the center of the distribution being represented and $\theta$ is the angle between the charge flow and line between the point current source and observation points. Because these potentials also determine the mutual admittances between sub units, these solutions permit the full determination of the parallel admittances of the overall metalization structure.

A method for determining the variation of the sub unit self and mutual electrical properties that arise from variations in sub unit length is to decompose a sub unit of perturbed length into the sum of the original sub unit plus a short physical extension to the sub unit. The self and mutual electrical characteristics of the sub unit extension can be determined through substitution of the previously determined sub unit charge distribution (found through Equation 28) into Equations 10, 13, 15 and 17 that describe the self and mutual interactions between charge elements that represent the sub unit extension.

The parallel metalization self and mutual admittances of the overall metalization structure are determined through the suitable combination of the representative sub units to form the larger structure and the tabulation of their characteristics and interactions when assembled into the larger structure in the following form:

$$I_{j-1} - I_j = V_j Y \rho_i + 2\pi i f \sum_{i \neq j} (V_j - V_i) C_{i,j}. \tag{36}$$

In Equation 36, $I_{j-1} - I_j$ represents currents that are derived from the series paths through parallel impedances. In Equation 36, the $Y\rho_j$, describing the capacitive and resistive admittances to a grounded substrate are much more important than the $C_{i,j}$, that describe the inter sub unit capacitances $$C_{i,j} = \sum_n \Phi_n(\rho/w, \theta).$$

The series impedances in Equation 27 are combined with a set of linear equations describing the parallel admittances of Equation 36 and the resulting system of equations (Equations 27 and 36) is solved for the two (2) port frequency dependent network admittances.

B. Preferred Embodiment(s)

Figure 1B:
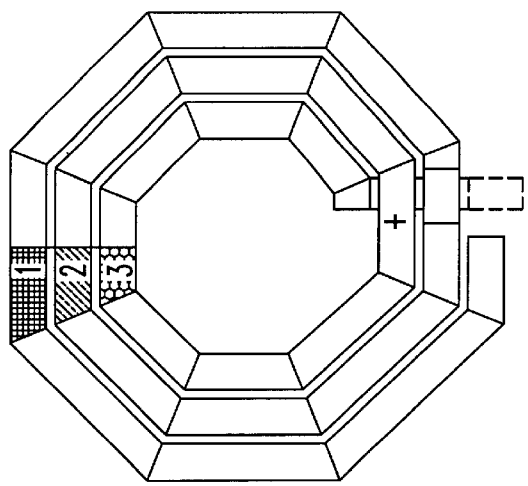
Figure 1C:
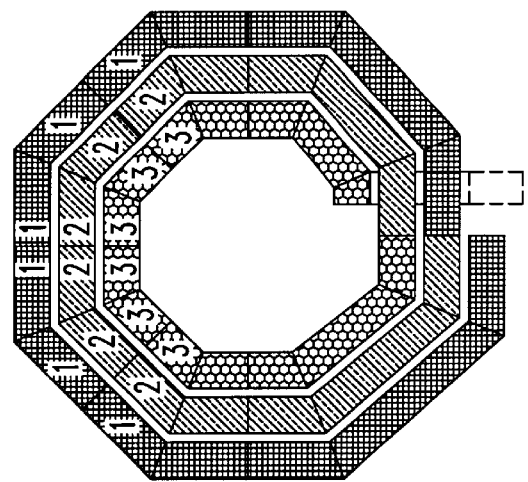

FIGS. 1A through 1C show, in simplified form, an inductor to be fabricated from circuit metalizations, as well as, the cross section of the metalization paths in the inductor. FIG. 1A shows three (3) sub units 1, 2 and 3 of an integrated circuit inductor as shown in FIGS. 1B and 1C. The uppermost metal 101 in each of the sub units is 3 um thick, while the lower metals 102 and 103 are each 0.5 um thick. The sub units 1, 2 and 3 form a portion of the overall integrated circuit inductor 100, which is fabricated on substrate 104. FIGS. 1B and 1C graphically illustrate overall inductor 100 including the representative sub units 1, 2 and 3. Note the high-lighted portions illustrating sub units 1, 2 and 3 in FIGS. 1B and 1C, and that the sub units have been partitioned into smaller sub elements as indicated, for example, by the cross hatching in sub unit 3.

Figure 2C:
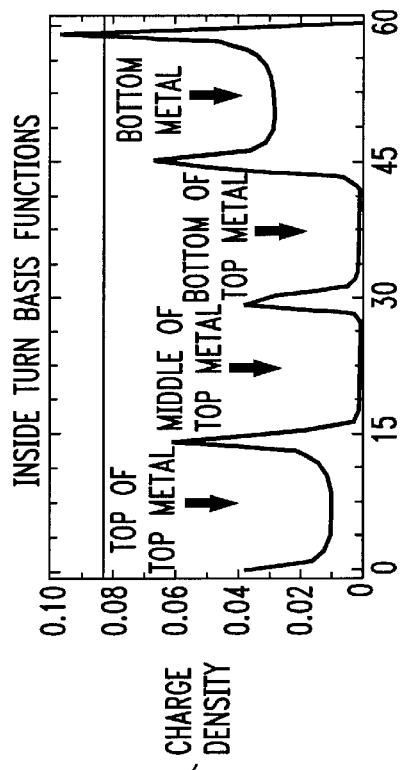
FIGS. 2A through 2D show, in simplified form, the current and charge distributions on a representative metalization sub unit (FIGS. 2A and 2B) selected from the inductor of FIG. 1.
Figure 2D:
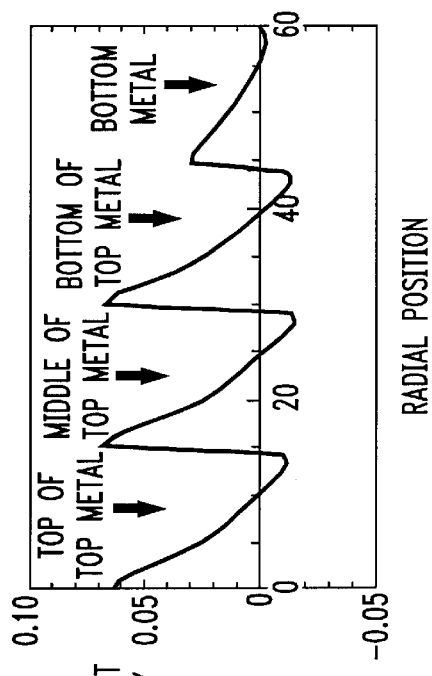
Figure 2A:
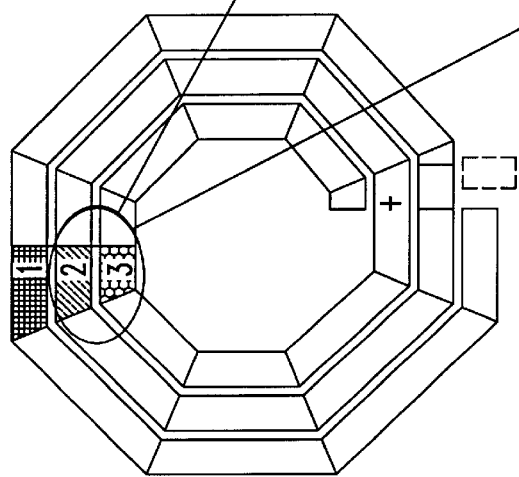
Figure 2B:
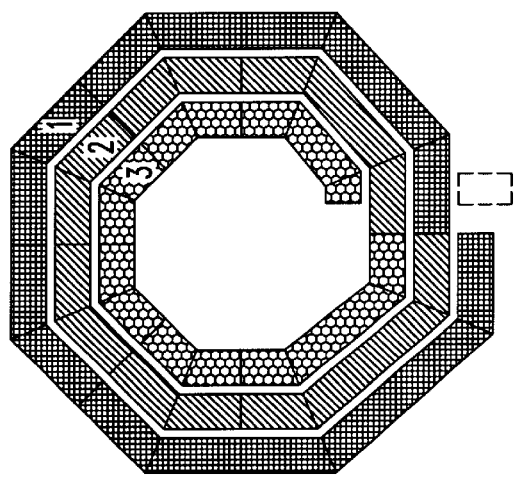

FIGS. 2A through 2D show, in simplified form, the current and charge distributions on a representative metalization sub unit 3 (FIGS. 2A and 2.B) selected from the inductor 100 of FIG. 1. Thus, FIG. 2A shows integrated circuit inductor 100 and sub units 1, 2 and 3. Similarly, FIG. 2B shows details of integrated circuit inductor 100 and also sub units 1,2 and 3. Specifically, in FIG. 2B, sub unit 1 is shown in dark shading sub unit 1, sub unit 2 is shown in intermediate shading and sub unit 3 is shown in lighter, shading. In this example, the charge density for so-called inside turn basis functions/Of sub unit 3 is shown in FIG. 2C and the current density for the inside turn basis functions of sub unit 3 is shown in FIG. 2D. As shown, both the charge density and current density are shown versus radial position for the top of the top metal 101 of the metal stack, the middle of the top metal, the bottom of the top metal and for the bottom metal 103.

FIG. 3 is a graphical representation illustrating test elements relative to lines of charge/current in a section of the inductor of FIG. 1. Shown are test elements 301, which are in parallel alignment relative the lines of current/charge 302 on a sub unit of inductor 100. Specifically, test elements 301 are in solid outline and delineated at each end solid by a dot, and the lines of charge/current 302 are in dotted outline. In FIG. 3, the test elements 301 and lines of charge/current 302 are shown relative to the groups of sub units 1, 2 and 3 of inductor 100.

Figure 4:
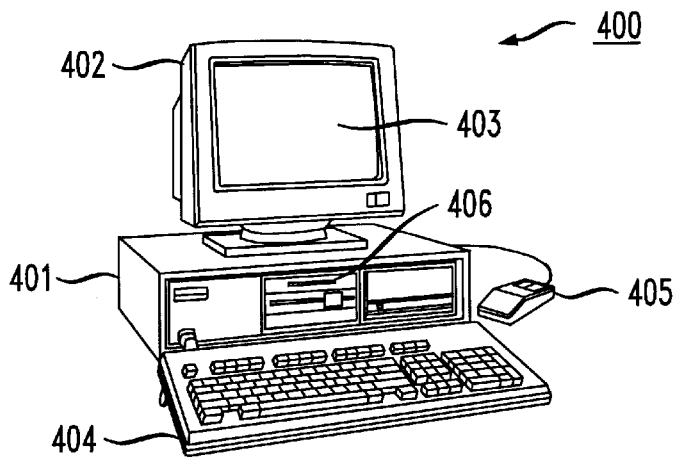
FIG. 4 shows, in simplified form, simulation apparatus including an embodiment of the invention.

FIG. 4 shows, in simplified form, simulation apparatus including an embodiment of the invention. Thus, shown is computer system 400 which may be, for example, a workstation of a type well known in the art, including a central processor, system memory, hard disk and the like (not shown) but housed in cabinet 401. Also included are monitor 402, display unit 403, keyboard 404 and pointing device, i.e., mouse 405. Cabinet 401 also houses a CD-ROM drive 406. The hard disk and system memory are employed in well known fashion to store and retrieve software programs incorporating code for effecting an embodiment of the invention. Additionally, cabinet 401 may also house a floppy disk drive (not shown).

Figure 5:
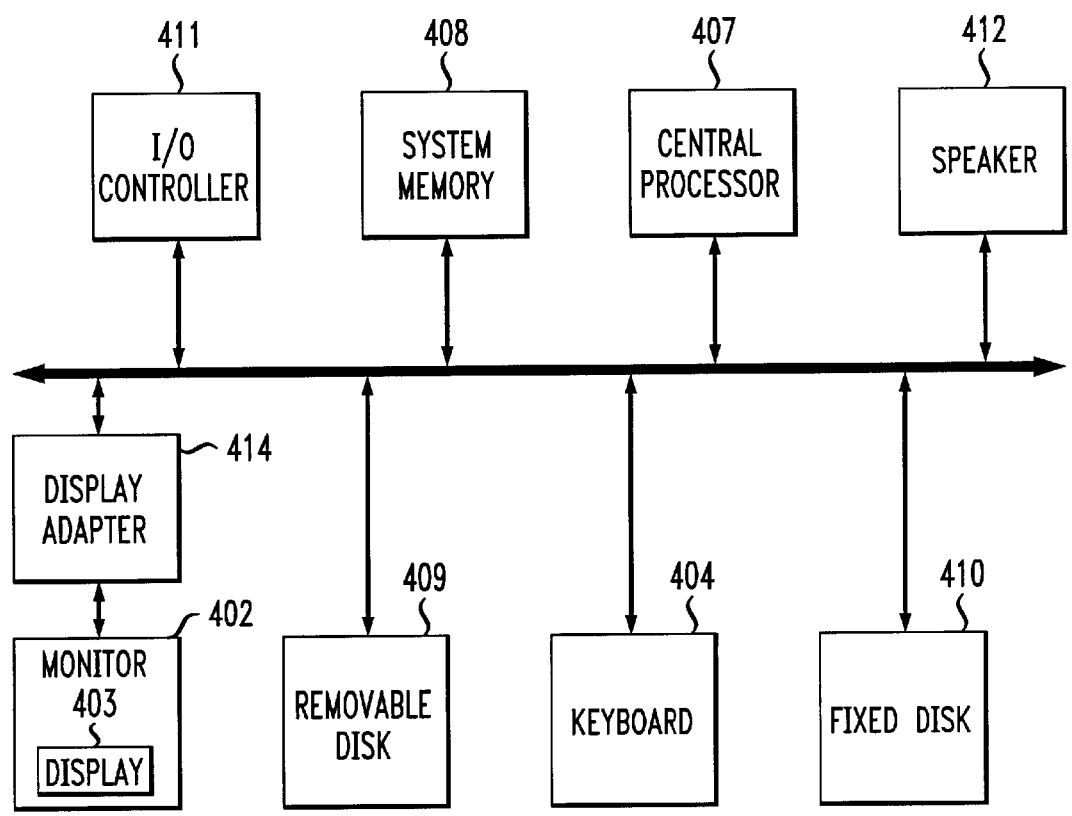
FIG. 5 shows, in simplified block diagram form, details of the apparatus of FIG. 4.

FIG. 5 shows, in simplified block diagram form, details of the apparatus of FIG. 4. Thus, shown is computer system 400 including monitor 402 including display unit 403, display adapter 414, keyboard 404, mouse 405, central processor 407, system memory 408, removable disk drive 409, hard disk drive 410, I/O controller 411 and 5 speaker 412 all interconnected via bus 413. Indeed, FIG. 5 illustrates but one arrangement for implementing an embodiment of the invention and other similar arrangements may be employed to equally practice one or more embodiments of the invention.

Figure 6:
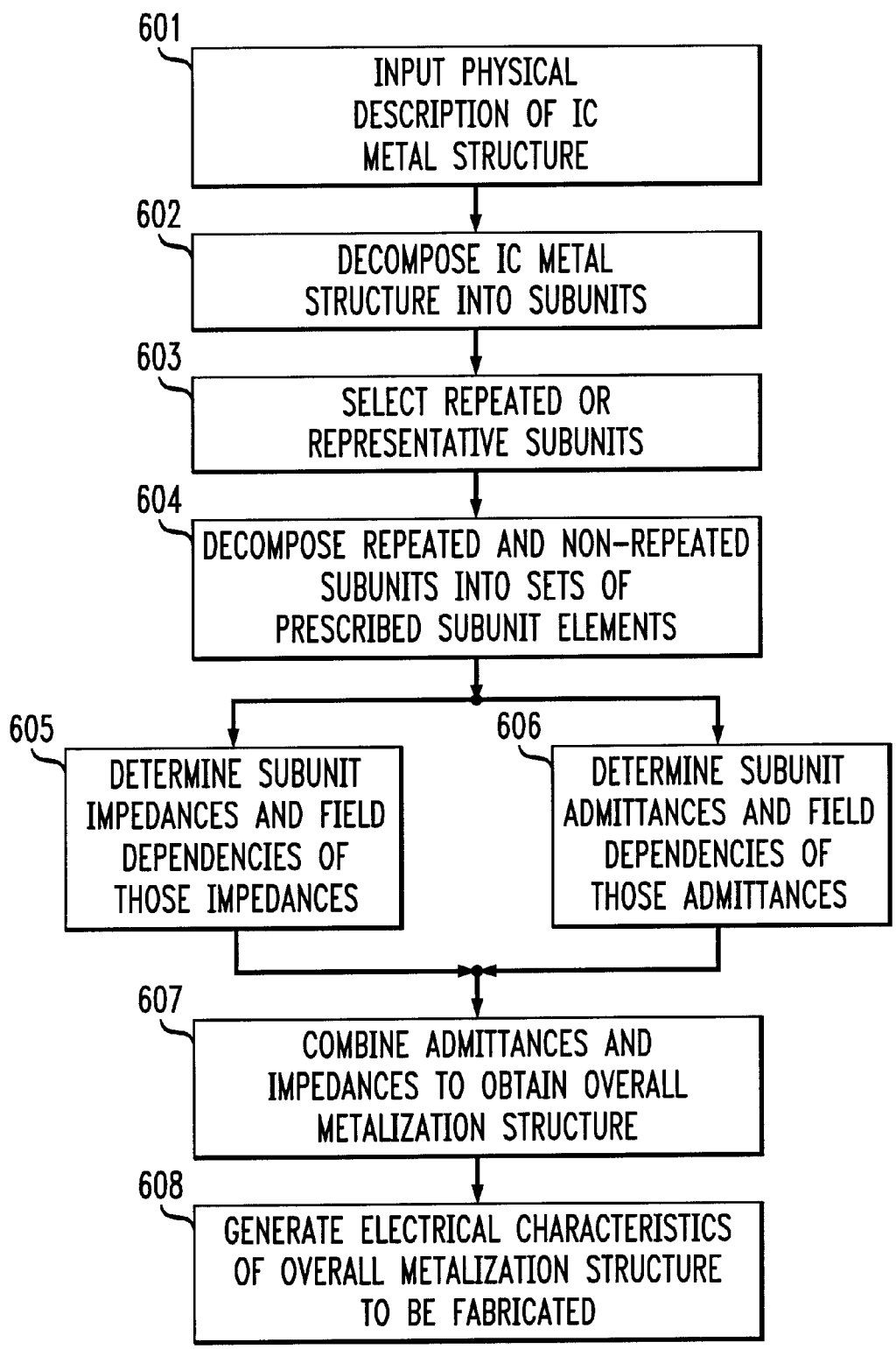
FIG. 6 is a flowchart illustrating steps in one embodiment of a simulation process including an embodiment of the invention.
Figure 7:
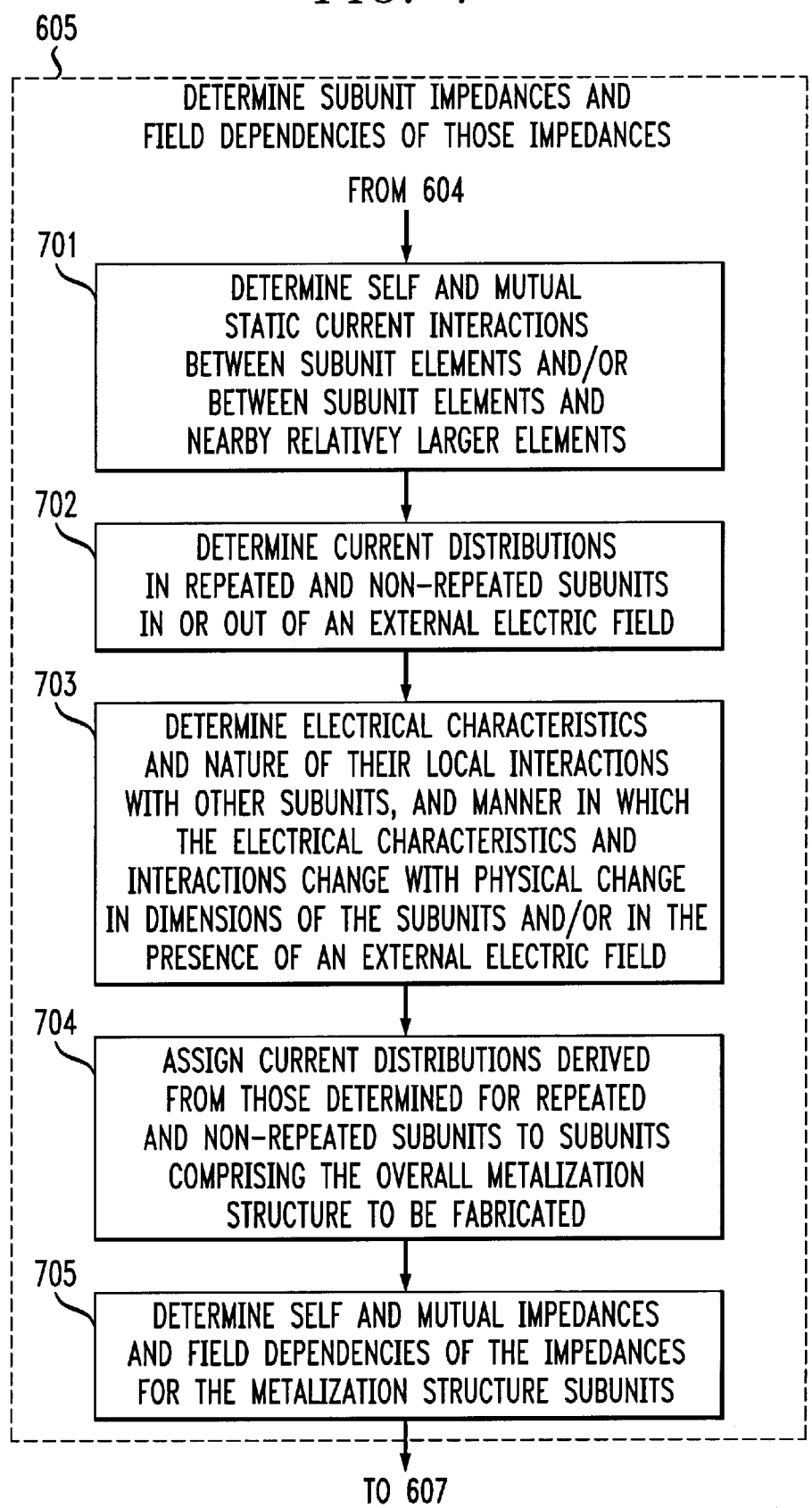
FIG. 7 is a flowchart illustrating steps in a determination process for the sub unit impedances and field dependencies of those impedances of FIG. 6.

FIG. 6 is a flowchart illustrating steps in one embodiment of a simulation process including an embodiment of the invention. In this embodiment, the flowchart of FIG. 6 when employed in the simulation apparatus of FIGS. 4 and 5 effects a so-called basis function decomposition process for modeling the charge and/or current distributions and the interactions of those distributions on metalization structures arising from voltages and currents flowing in the metalization structures. In step 601, the physical description is inputted of the metal structure that is to be fabricated on the conductive substrate. Step 602 causes the inputted metal structure to be decomposed into metalization structure sub units. Step 603 causes repeated or representative sub units to be determined. This is realized by comparing the physical dimensions (shapes) of the sub units with the physical dimensions of other sub units to determine if they are the same or substantially similar. If so, then the sub unit is designated as being repeated or representative of one or more other sub units. If the sub unit is not similar in shape to any other sub unit, then it is considered to be non-repeated. In step 604 the repeated or representative sub units are decomposed into sets of much smaller sized sub unit elements. Step 605 uses the sub unit elements to determine the sub unit impedances and field dependencies of those impedances. Details of step 605 are shown in the flowchart of FIG. 7 and described below. Similarly, Step 606 uses the sub unit elements to determine the sub unit admittances and field dependencies of those admittances. Details of step 606 are shown in the flowchart of FIG. 8 and described below. Then, step 607 causes the impedances and admittances to be combined to obtain the overall metalization structure to be fabricated. Finally, step 608 causes electrical characteristics to be generated of the overall metalization structure to be fabricated. Also see an article entitled "Analysis, Design, and Optimization of Spiral Inductors and Transformers for Si RF IC's", authored by A. M. Niknejad et al., *IEEE Journal Of Solid-State Circuits,* Vol. 33, No. 10, pages 1470–1481, October 1998, that discloses a computer-aided-design tool that may use the parameters, including the charge and/or current distributions, generated by the instant invention to generate the electrical characteristics of overall metalization structures, for example, inductors in integrated circuits.

FIG. 7 is a flowchart of the sub unit impedance and field dependencies of those impedances determination process step 605 of FIG. 6. Specifically, in step 701, self and mutual magneto static current interactions are determined between sub unit elements and/or between sub unit elements and nearby relatively larger elements than the sub unit elements. Step 702 causes current distributions to be determined in repeated and non-repeated sub units in or out of an external electric field. This is achieved through use of the magneto static current interactions determined in step 701 to determine the currents on the sub unit elements that comprise the sub units in or out of an external electric field. Step 703 uses the current distributions of the repeated and non-repeated sub units to determine their electrical characteristics and the nature of their local interactions with other sub units, and the manner in which those electrical characteristics and interactions change with physical change in the dimensions of the sub units and/or in the presence of an external electric field. Step 704 causes the sub units that form the overall metalization structure to be fabricated to be assigned current distributions derived from those determined for the repeated and non-repeated sub units in step 702. Step 705 determines self and mutual impedances and the field dependencies of those impedances for the metalization structure sub units.

FIG. 8 is a flowchart of the sub unit admittance and field dependencies of those admittances determination process of FIG. 6. Specifically, in step 801, self and mutual static or quasi-static charge interactions are determined between sub unit elements and/or between sub unit elements and nearby relatively larger elements than the sub unit elements. Step 802 causes charges distributions to be determined in repeated and non-repeated sub units in or out of an external electric field. This is achieved through use of the static charge interactions determined in step 801 to determine the charges on the sub unit elements that comprise the sub units in or out of an external electric field. Step 803 uses the charge distributions of the repeated and non-repeated sub units to determine their electrical characteristics and the nature of their local interactions with other sub units, and the manner in which those electrical characteristics and interactions change with physical change in the dimensions of the sub units and/or in the presence of an external electric field. Step 804 causes the sub units that form the overall metalization structure to be fabricated to be assigned current distributions derived from those determined for the repeated and non-repeated sub units in step 802. Step 805 determines self and mutual admittances and the field dependencies of those admittances for the metalization structure sub units.

The above-described methods and apparatus are, of course, merely illustrative of the principles of the invention. Indeed, numerous other methods or apparatus may be devised by those skilled in the art without departing from the spirit and scope of the invention.

What is claimed is:

1. A method for use in computer aided simulation apparatus to model metalization structures, for example, inductors, interconnects or the like, in electrical circuits comprising the steps of:

partitioning of a metalization structure to be fabricated into a plurality of prescribed metalization structure sub units including one or more repeated sub units and/or one or more non-repeated sub units;

forming one or more individual groups of sub units, each group including a prescribed number of sub units;

determining which of said plurality of sub units are repeated and/or representative of one or more of others of said sub units;

determining current distributions for at least one prescribed sub unit;

utilizing said current distributions in accordance with first prescribed criteria to determine self and mutual impedances of said prescribed number of said plurality of said repeated and non-repeated sub units in each group;

determining charge distributions for said at least one prescribed sub unit;

utilizing said charge distributions in accordance with second prescribed criteria to determine self and mutual admittances of said prescribed number of said plurality of said repeated and non-repeated sub units in each group; and combining said determined impedances and said determined admittances in accordance with prescribed criteria, wherein said combined impedances and said combined admittances represent electrical characteristics of an overall physical metalization structure to be fabricated.

2. The method as defined in claim 1 wherein said step of determining said impedances includes a step of determining simultaneously said impedances of said prescribed number of said plurality of metalization sub units in each group.

3. The method as defined in claim 1 wherein said step of determining said impedances includes a step of determining independently said impedances of said prescribed number of said plurality of metalization sub units in each group.

4. The method as defined in claim 1 wherein said step of determining said admittances includes a step of determining simultaneously said admittances of said prescribed number of said plurality of metalization sub units in each group.

5. The method as defined in claim 1 wherein said step of determining said admittances includes a step of determining independently said admittances of said prescribed number of said plurality of metalization sub units in each group.

6. The method as defined in claim 1 wherein said step of partitioning further includes partitioning each of said prescribed sub units into a plurality of sub elements.

7. The method as defined in claim 6 wherein said step of determining said current distributions includes a step of determining current distributions of said sub elements in said sub units.

8. The method as defined in claim 6 wherein said step of determining said charge distributions includes a step of determining charge distributions of said sub elements in said sub units.

9. The method as defined in claim 1 wherein said sub units have a length and the length of prescribed sub units is extended, and wherein current and charge distributions of said extended length sub units are utilized to determine impedances and admittances for said extended length sub units.

10. A method for use in computer aided simulation apparatus to model metal structures in electrical circuits comprising the steps of:

partitioning of a metal structure to be fabricated into a plurality of prescribed metalization structure sub units including one or more repeated sub units and/or one or more non-repeated sub units;

determining which of said plurality of sub units are repeated and/or representative of one or more of others of said sub units;

determining current distributions for at least one prescribed sub unit utilizing a uniform current in said sub units to determine said current distributions;

utilizing said current distributions in accordance with first prescribed criteria to determine self and mutual impedances of said repeated and non-repeated sub units;

determining charge distributions for said at least one prescribed sub unit;

utilizing said charge distributions in accordance with second prescribed criteria to determine self and mutual admittances of said repeated and non-repeated sub units; and combining said determined impedances and said determined admittances in accordance with prescribed criteria, wherein said combined impedances and said combined admittances represent electrical characteristics of an overall physical metalization structure to be fabricated.

11. The method as defined in claim 10 wherein said uniform current is assumed to arise from excitation currents in said overall metalization structure whose distributions are invariant across widths of associated sub units.

12. The method as defined in claim 11 wherein test elements are associated with said sub elements and wherein said step of determining said current distributions includes utilizing said uniform current in said sub units to determine said current distributions through the currents in said sub elements in each sub unit, and further including steps of determining a voltage across each of said test elements and utilizing said voltage and said current in said test element to determine an impedance.

13. A method for use in computer aided simulation apparatus to model metal structures in electrical circuits comprising the steps of:

partitioning of a metal structure to be fabricated into a plurality of prescribed metalization structure sub units including one or more repeated sub units and/or one or more non-repeated sub units;

determining which of said plurality of sub units are repeated and/or representative of one or more of others of said sub units;

determining current distributions for at least one prescribed sub unit;

utilizing said current distributions in accordance with first prescribed criteria to determine self and mutual impedances of said repeated and non-repeated sub units;

determining charge distributions for said at least one prescribed sub unit utilizing a uniform current in said sub units to determine said charge distributions;

utilizing said charge distributions in accordance with second prescribed criteria to determine self and mutual admittances of said repeated and non-repeated sub units; and combining said determined impedances and combining said determined admittances in accordance with prescribed criteria, wherein said combined impedances and said combined admittances represent electrical characteristics of an overall physical metalization structure to be fabricated.

14. The method as defined in claim 13 wherein said uniform current is assumed to arise from excitation currents in said overall metalization structure whose distributions are invariant across widths of associated sub units.

15. The method as defined in claim 14 wherein test elements are associated with said sub elements and wherein said step of determining said charge distributions includes utilizing said uniform current in said sub units to determine said charge distributions caused by the currents in said sub elements in each sub unit, and further including steps of determining a potential for each of said test elements and utilizing said potential and said charge in said test element to determine an admittance.

16. Apparatus for use in computer aided simulation apparatus to model metalization structures, for example, inductors, interconnects or the like, in electrical circuits comprising:

means for partitioning of a metalization structure to be fabricated into a plurality of prescribed metalization structure sub units including one or more repeated sub units and/or one or more non-repeated sub units;

means for forming one or more individual groups of sub units, each group including a prescribed number of sub units;

means for determining which of said plurality of sub units are repeated and/or representative of one or more of others of said sub units;

means for determining current distributions for at least one prescribed sub unit;

means for utilizing said current distributions in accordance with first prescribed criteria to determine self and mutual impedances of said prescribed number of said plurality of said repeated and non-repeated sub units in each group;

means for determining charge distributions for said at least one prescribed sub unit;

means for utilizing said charge distributions in accordance with second prescribed criteria to determine self and mutual admittances of said number of said plurality of said repeated and non-repeated sub units in each group; and means for combining said determined impedances and said determined admittances in accordance with prescribed criteria, wherein said combined impedances and said combined admittances represent electrical characteristics of an overall physical metalization structure to be fabricated.

17. The invention as defined in claim 16 wherein said means for determining said impedances includes means for determining simultaneously said impedances of said prescribed number of said plurality of metalization sub units in each group.

18. The invention as defined in claim 16 wherein said means for determining said impedances includes means for determining independently said impedances of said prescribed number of said plurality of metalization sub units in each group.

19. The invention as defined in claim 16 wherein said means for determining said admittances includes means for determining simultaneously said admittances of said prescribed number of said plurality of metalization sub units in each group.

20. The invention as defined in claim 16 wherein said means for determining said admittances includes means for determining independently said admittances of said prescribed number of said plurality of metalization sub units in each group.

21. The invention as defined in claim 16 wherein said means for partitioning further includes means for partitioning each of said prescribed sub units into a plurality of sub elements.

22. The invention as defined in claim 21 wherein said means for determining said current distributions includes means for determining current distributions of said sub elements in said sub units.

23. The invention as defined in claim 22 wherein said means for determining said charge distributions includes means for determining charge distributions of said sub elements in said sub units.

24. Apparatus for use in computer aided simulation apparatus to model metalization structures, for example, inductors, interconnects or the like, in electrical circuits comprising:

means for partitioning of a metalization structure to be fabricated into a plurality prescribed metalization structure sub units including one or more repeated sub units and/or one or more non-repeated sub units;

means for forming one or more individual groups of sub units, each group including a prescribed number of sub units;

means for determining which of said plurality of sub units are repeated and/or representative of one or more of others of said sub units;

means for determining current distributions for at least one prescribed sub unit utilizing a uniform current in said sub units to determine said current distributions;

means for utilizing said current distributions in accordance with first prescribed criteria to determine self and mutual impedances of said prescribed number of said plurality of said repeated and non-repeated sub units in each group;

means for determining charge distributions for said at least one prescribed sub unit;

means for utilizing said charge distributions in accordance with second prescribed criteria to determine self and mutual admittances of said prescribed number of said plurality of said repeated and non-repeated sub units in each group; and means for combining said determined impedances and for combining said determined admittances in accordance with prescribed criteria, wherein said combined impedances and said combined admittances represent electrical characteristics of an overall physical metalization structure to be fabricated.

25. The invention as defined in claim 24 wherein said uniform current is assumed to arise from excitation currents in said overall metalization structure whose distributions are invariant across widths of associated sub units.

26. The invention as defined in claim 25 wherein test elements are associated with said sub elements and wherein said means for determining said current distributions includes means for utilizing said uniform current in said sub units to determine said current distributions through the currents in said sub elements in each sub unit, and further including means for determining a voltage across each of said test elements and utilizing said voltage and said current in said test element to determine an impedance.

27. Apparatus for use in computer aided simulation apparatus to model metalization structures, for example, inductors, interconnects or the like, in electrical circuits comprising:

means for partitioning of a metalization structure to be fabricated into a plurality prescribed metalization structure sub units including one or more repeated sub units and/or one or more non-repeated sub units;

means for determining which of said plurality of sub units are repeated and/or representative of one or more of others of said sub units;

means for determining current distributions for at least one prescribed sub unit utilizing a uniform current in said sub units to determine said current distributions;

means for utilizing said current distributions in accordance with first prescribed criteria to determine self and mutual impedances of said repeated and non-repeated sub units;

means for determining charge distributions for said at least one prescribed sub unit utilizing a uniform current in said sub units to determined said charge distributions;

means for utilizing said charge distributions in accordance with second prescribed criteria to determine self and mutual admittances of said repeated and non-repeated sub units; and means for combining said determined impedances and for combining said determined admittances in accordance with prescribed criteria, wherein said combined impedances and said combine admittances represent electrical characteristics of an overall physical metalization structure to be fabricated.

28. The invention as defined in claim 27 wherein said uniform current is assumed to arise from excitation currents in said overall metalization structure whose distributions are invariant across widths of associated sub units.

29. The invention as defined in claim 28 wherein test elements are associated with said sub elements and wherein said means for determining said charge distributions includes means for utilizing said uniform current in said sub units to determine said charge distributions caused by the currents in said sub elements in each sub unit, and further including means for determining a potential for each of said test elements and utilizing said potential and said charge in said test element to determine an admittance.

30. The invention as defined in claim 16 wherein said sub units have a length and the length of prescribed sub units is extended, and further including means for determining current and charge distributions of said extended length sub units and for utilizing said determined current and charge distributions for said extended sub units to determine impedances and admittances for said extended length sub units.

31. Apparatus for use in computer aided simulation apparatus to model metalization structures, for example, inductors, interconnects or the like, in electrical circuits comprising:

a partitioner for partitioning of a metalization structure to be fabricated into a plurality of prescribed metalization structure sub units including one or more repeated sub units and/or one or more non-repeated sub units;

a forming unit to form one or more individual groups of sub units, each group including a prescribed number of sub units;

first determination apparatus that determines which of said plurality of sub units are repeated and/or representative of one or more of others of said sub units;

second determination apparatus that determines current distributions for at least one prescribed sub unit;

first utilization apparatus utilizing said current distributions in accordance with first prescribed criteria to determine self and mutual impedances of said prescribed number of said plurality of said repeated and non-repeated sub units in each group;

third determination apparatus that determines charge distributions for said at least one prescribed sub unit;

second utilization apparatus utilizing said charge distributions in accordance with second prescribed criteria to determine self and mutual admittances of said prescribed number of said plurality of said repeated and non-repeated sub units in each group; and a combiner to combine said determined impedances and to combine said determined admittances;

wherein said combined impedances and said combined admittances represent electrical characteristics of an overall physical metalization structure to be fabricated.

32. The invention as defined in claim 31 wherein said first utilization apparatus simultaneously determines said impedances of said prescribed number of said plurality of metalization sub units in each group.

33. The invention as defined in claim 31 wherein said first utilization apparatus independently determines impedances of said prescribed number of said plurality of metalization sub units in each group.

34. The invention as defined in claim 31 wherein said second utilization apparatus simultaneously determines admittances of said prescribed number of said plurality of metalization sub units in each group.

35. The invention as defined in claim 31 wherein said second utilization apparatus independently determines admittances of said prescribed number of said plurality of metalization sub units in each group.

36. The invention as defined in claim 31 wherein said partitioner further partitions each of said prescribed sub units into a plurality of sub elements.

37. The invention as defined in claim 36 wherein said second determination apparatus determines current distributions of said sub elements in said sub units.

38. The invention as defined in claim 37 wherein said third determination apparatus determines charge distributions of said sub elements in said sub units.

39. Apparatus for use in computer aided simulation apparatus to model metalization structures, for example, inductors, interconnects or the like, in electrical circuits comprising:

a partitioner for partitioning of a metalization structure to be fabricated into a plurality of prescribed metalization structure sub units including one or more repeated sub units and/or one or more non-repeated sub units;

a forming unit to form one or more individual groups of sub units, each group including a prescribed number of sub units;

first determination apparatus that determines which of said plurality of sub units are repeated and/or representative of one or more of others of said sub units;

second determination apparatus that determines current distributions for at least one prescribed sub unit and utilizes a uniform current in said sub units to determine said current distributions;

first utilization apparatus utilizing said current in accordance with first prescribed criteria to determine self and mutual impedances of said prescribed number of said plurality of said repeated and non-repeated sub units in each group;

third determination apparatus that determines charge distributions for said at least one prescribed sub unit;

second utilization apparatus utilizing said charge in accordance with second prescribed criteria to determine self and mutual admittances of said prescribed number of said plurality of said repeated and non-repeated sub units in each group;

a combiner to combine said determined impedances and to combine said determined admittances, wherein said combined impedances and said combined admittances represent electrical characteristics of an overall physical metalization structure to be fabricated.

40. The invention as defined in claim 39 wherein said uniform current is assumed to arise from excitation currents in said overall metalization structure whose distributions are invariant across widths of associated sub units.

41. The invention as defined in claim 40 wherein said third determination apparatus utilizes a uniform current in said sub units to determine said charge distributions.

42. The invention as defined in claim 40 wherein test elements are associated with said sub elements and wherein said second determination apparatus utilizes said uniform current in said sub units to determine said current distributions through the currents in said sub elements in each sub unit, and further determines a voltage across each of said test elements and utilizes said voltage and said current in said test element to determine an impedance.

43. The invention as defined in claim 39 wherein test elements are associated with said sub elements and wherein said third determination apparatus utilizes said uniform current in said sub units to determined said charge distributions caused by the currents in said sub elements in each sub unit, and further determines a potential for each of said test elements and utilizes said potential and said charge in said test element to determine an admittance.

44. The invention as defined in claim 31 wherein said sub units have a length and the length of prescribed sub units is extended, and further including fourth determination apparatus for determining current and charge distributions of said extended length sub units and for utilizing said determined current and charge distributions for said extended sub units to determine impedances and admittances for said extended length sub units.

* * * * *